United States Patent
Lee et al.

(10) Patent No.: US 9,419,197 B2
(45) Date of Patent: Aug. 16, 2016

(54) THERMOELECTRIC MATERIAL AND METHOD OF PREPARING THE THERMOELECTRIC MATERIAL

(71) Applicant: Samsung Electronics Co., Ltd., Suwon-si, Gyeonggi-do (KR)

(72) Inventors: Sang-mock Lee, Yongin-si (KR); Kyu-hyoung Lee, Hwaseong-si (KR); Sung-ho Jin, San Diego, CA (US); Ami Berkowitz, San Diego, CA (US)

(73) Assignees: SAMSUNG ELECTRONICS CO., LTD. (KR); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 652 days.

(21) Appl. No.: 13/783,559

(22) Filed: Mar. 4, 2013

(65) Prior Publication Data

US 2013/0298729 A1 Nov. 14, 2013

(30) Foreign Application Priority Data

May 9, 2012 (KR) ........................ 10-2012-0049268

(51) Int. Cl.
*C22C 12/00* (2006.01)
*C01B 19/00* (2006.01)
*B22F 9/14* (2006.01)
*H01L 35/18* (2006.01)
(Continued)

(52) U.S. Cl.
CPC . *H01L 35/18* (2013.01); *B22F 9/14* (2013.01); *B82Y 30/00* (2013.01); *C01B 19/002* (2013.01); *C01B 19/007* (2013.01); *C22C 1/04* (2013.01); *C22C 12/00* (2013.01); *C22C 28/00* (2013.01); *H01L 35/16* (2013.01); *H01L 35/34* (2013.01); *C01P 2002/50* (2013.01); *C01P 2004/03* (2013.01); *C01P 2004/51* (2013.01); *C01P 2004/64* (2013.01); *C01P 2006/40* (2013.01); *Y10S 977/901* (2013.01); *Y10S 977/932* (2013.01); *Y10T 428/12* (2015.01); *Y10T 428/2982* (2015.01); *Y10T 428/2989* (2015.01)

(58) Field of Classification Search
None
See application file for complete search history.

(56) References Cited

U.S. PATENT DOCUMENTS 4,759,905 A 7/1988 Walter et al.
5,981,863 A 11/1999 Yamashita et al.
(Continued)

FOREIGN PATENT DOCUMENTS

GB 968508 A * 9/1964

OTHER PUBLICATIONS

Hansen et al., "Exchange-spring permanent magnet particles produced by spark-erosion", Applied Physics Letters, 82, No. 10, Mar. 10, 2003, pp. 1574-1576.
(Continued)

*Primary Examiner* — George Wyszomierski
(74) *Attorney, Agent, or Firm* — Cantor Colburn LLP

(57) ABSTRACT

A method of preparing thermoelectric material particles, the method comprising: disposing a first electrode and a second electrode in a dielectric liquid medium, wherein the first and second electrodes each comprise a thermoelectric material; applying an electrical potential between the first and second electrodes to cause a spark between the first and second electrodes to provide a vaporized thermoelectric material at a sparking point of at least one of the first and second electrodes; and cooling the vaporized thermoelectric material with the dielectric liquid medium to prepare the thermoelectric material particles.

16 Claims, 13 Drawing Sheets

(51) Int. Cl.
  *H01L 35/34* (2006.01)
  *B82Y 30/00* (2011.01)
  *H01L 35/16* (2006.01)
  *C22C 1/04* (2006.01)
  *C22C 28/00* (2006.01)

(56) References Cited

U.S. PATENT DOCUMENTS

| | | |
|---|---|---|
| 6,596,226 B1 | 7/2003 | Simard et al. |
| 7,255,846 B2 | 8/2007 | Ren et al. |
| 2008/0202575 A1 | 8/2008 | Ren et al. |
| 2011/0006249 A1 | 1/2011 | Chen et al. |
| 2011/0120517 A1 | 5/2011 | Li |
| 2014/0291296 A1* | 10/2014 | Jin .................... B23H 1/04 219/69.16 |

OTHER PUBLICATIONS

Tang et al., "Microstructure and exchange coupling in nanocrystalline Nd2(FeCo)14B/a-FeCo particles produced by spark erosion", Applied Physics Letters, 86, 2005, pp. 122507-1-122507-3.

Venkatasubramanian et al., "Thin-film thermoelectric devices with high room-temperature figures of merit", Nature, vol. 413. Oct. 2001, pp. 597-602.

* cited by examiner

THERMOELECTRIC MATERIAL AND METHOD OF PREPARING THE THERMOELECTRIC MATERIAL

CROSS-REFERENCE TO RELATED APPLICATIONS

This application claims priority to and the benefit of Korean Patent Application No. 10-2012-0049268, filed on May 9, 2012, and all the benefits accruing therefrom under 35 U.S.C. §119, the content of which is incorporated herein in its entirety by reference.

BACKGROUND

1. Field

Aspects of this disclosure relate to a thermoelectric material and a method of preparing the thermoelectric material.

2. Description of the Related Art

The thermoelectric effect refers to the phenomenon of conversion of a temperature difference into an electric voltage or vice versa. A thermoelectric material creates an electrical potential when there is a temperature difference on opposite ends of the thermoelectric material, thus generating electricity, or creates a temperature difference between opposite ends of the thermoelectric material when an electrical potential is applied thereto. Therefore, thermoelectric elements may be used in power generation devices using temperature differences, cooling or heating devices that use electricity, temperature sensors, and the like. The thermoelectric effect encompasses three effects: the Seebeck effect, the Peltier effect, and the Thomson effect.

The technical field of thermoelectric materials and devices has expanded significantly because thermoelectric materials and devices are promisingly applicable to solid state cooling and solid state power generation. Nonetheless, there remains a need for an improved method of preparing thermoelectric materials.

SUMMARY

Provided is a method of preparing high-purity and ultrafine thermoelectric material nanoparticles at industrially useful rates and yields whereby oxidization of the thermoelectric material nanoparticles is minimized.

Additional aspects will be set forth in part in the description which follows and, in part, will be apparent from the description.

According to an aspect, disclosed is a method of preparing thermoelectric material particles, the method comprising: disposing a first electrode and a second electrode in a dielectric liquid medium, wherein the first and second electrodes each comprise a thermoelectric material; applying an electrical potential between the first and second electrodes to cause a spark between the first and second electrodes to provide a vaporized thermoelectric material at a sparking point of at least one of the first and second electrodes; and cooling the vaporized thermoelectric material with the dielectric liquid medium to prepare the thermoelectric material nanoparticles.

At least one of the first and second electrodes may further include a filler.

The dielectric liquid medium may further include a nano-dispersed filler or a dissolved filler.

According to another aspect, the thermoelectric powder includes thermoelectric material particles prepared according to the method of preparing thermoelectric material particles.

According to another aspect, a thermoelectric powder includes thermoelectric material particles having an average particle diameter of about 10 to about 100 nanometers (nm).

The thermoelectric powder may include thermoelectric material microparticles having a particle diameter of about 0.1 to about 10 micrometers (μm) and having a nano-grained structure.

The thermoelectric material particles of the thermoelectric powder may further include a filler.

According to another aspect, a method of preparing a sintered bulk thermoelectric material includes compacting the thermoelectric powder and sintering the compacted thermoelectric powder.

According to another aspect, provided is a sintered bulk thermoelectric material prepared using the method of preparing a sintered bulk thermoelectric material.

According to another aspect, provided is a sintered bulk thermoelectric material having an average particle diameter of about 10 to about 100 nm and having a nano-grained structure including thermoelectric nano-grains.

The thermoelectric nano-grains of the sintered bulk thermoelectric material may further include a filler phase.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
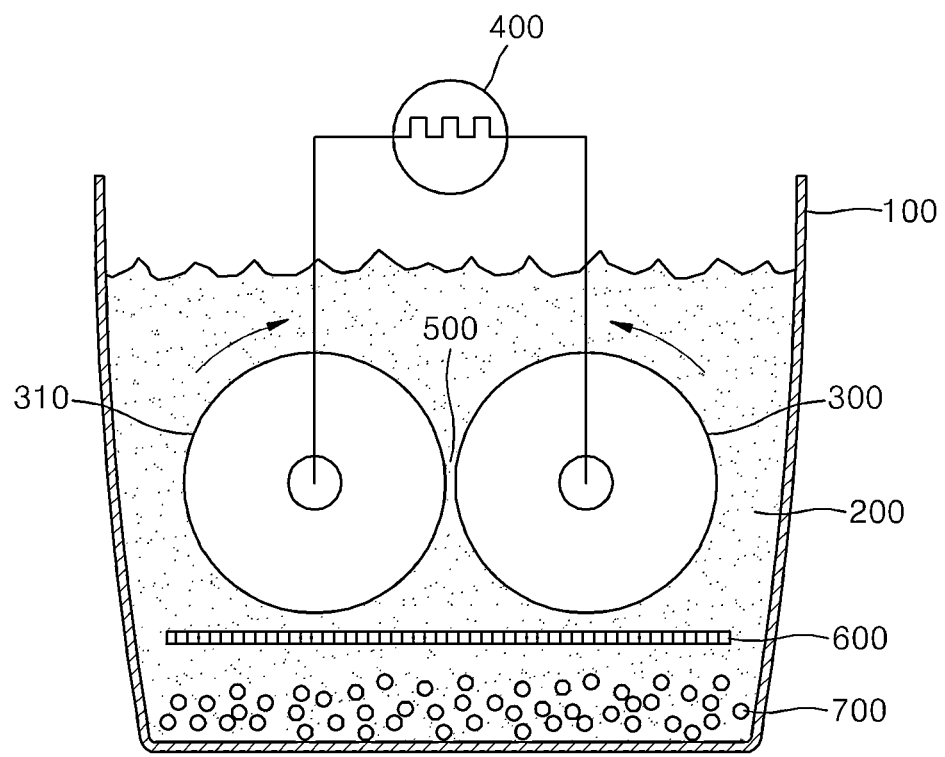
FIG. 1 is a diagram illustrating an embodiment of a method of preparing thermoelectric particles using two rotating disk electrodes, each consisting of a bulk thermoelectric material.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The thermoelectric performance of thermoelectric materials may be quantified by a dimensionless figure of merit ZT, wherein T is absolute temperature, and $Z=S^2\sigma/\kappa$, where S is the Seebeck coefficient (e.g., in Volts/degree K), σ is electrical conductivity (e.g., in [1/Ω-meter), and k is thermal conductivity (e.g., in Watts/meter-degree K). It is now commonly accepted that thermoelectric materials having a dimensionless figure of merit ZT of greater than 1 are suitable for use in heat recovery and space power applications, and thermoelectric materials having a dimensionless figure of merit ZT of much greater than 1 would be suitable for power generators and heat pumps. However, bulk thermoelectric materials generally do not have suitable efficiencies in terms of energy conversion or energy transfer. As nanotechnology and an advanced material preparation technology have progressed, a quantum-confined structure such as a quantum well can be artificially formed, and a heat to electricity energy conversion efficiency is expected to be innovatively improved by using such a quantum-confined structure. Indeed, studies on these structures have shown a steadily increasing dimensionless figure of merit ZT.

The dimensionless figure of merit ZT may be increased by increasing the Seebeck coefficient and electrical conductivity or decreasing the thermal conductivity. The Seebeck coefficient S depends on a density of states (DOS), and can be increased by increasing the density of states DOS of a thermoelectric material by using a reduced dimensional structure, such as a two-dimensional quantum well, or one-dimensional nanowires, which results in an improved dimensionless figure of merit ZT. The thermal conductivity k can be defined as a sum of contribution from carriers, i.e., electrons or holes, and a lattice thermal conductivity contributed by lattice, i.e., phonons. In this regard, when the transfer of carriers is disrupted, the contribution of carriers is decreased, and thus, the thermal conductivity k is decreased and the electrical conductivity is also decreased. Therefore, this method is not suitable for increasing the dimensionless figure of merit ZT. Thus, to increase the dimensionless figure of merit ZT by decreasing thermal conductivity, it can be desirable to reduce only the lattice thermal conductivity by scattering only phonons.

It is known that when the characteristic size of a thermoelectric material is controlled at a nanoscale level, the interface density of the thermoelectric material is significantly increased, which enables phonons to effectively scatter, and thus the lattice thermal conductivity thereof decreases, resulting in significantly improved dimensionless figure of merit ZT, as compared to bulk thermoelectric materials. That is, when the size of particles or grains of a thermoelectric material decreases at a nanoscale level, the density of the interface between grains, i.e., a grain boundary, largely increases, and thus, phonon scattering by the grain boundary increases, which leads to reduced lattice thermal conductivity, resulting in an improved dimensionless figure of merit ZT. Therefore, preparation of nanoparticles of a thermoelectric material is recognized as a desirable technology for increasing the dimensionless figure of merit ZT of the thermoelectric material.

The nanoparticles of a thermoelectric material may be prepared by, for example, atomization, chemical precipitation, or mechanical grinding. However, it is difficult to prepare nano-sized particles with a high yield and on an industrial scale using these methods. The preparation of thermoelectric material nanoparticles by mechanical grinding is time-consuming and may cause undesired oxidation on surfaces of the nanoparticles. In addition, steel balls or ceramic balls used during mechanical grinding are abraded, and thus, undesired contamination may occur in the thermoelectric material nanoparticles. Thus there remains a need for an improved method for preparing thermoelectric material particles.

In an embodiment, disclosed is a method of preparing thermoelectric material particles, the method comprising: disposing a first electrode and a second electrode in a dielectric liquid medium, wherein the first and second electrodes each comprise a thermoelectric material; applying an electric potential between the first and second electrodes to cause a spark between the first and second electrodes to provide a vaporized thermoelectric material at a sparking point of at least one of the first and second electrodes; and cooling the vaporized thermoelectric material with the dielectric liquid medium to prepare the thermoelectric material particles.

The dielectric liquid medium may be, for example, water, an organic solvent, a cryogenic liquefied gas, or a combination thereof.

The cryogenic liquefied gas is useful for preventing oxidation of a surface of thermoelectric material particles. In the preparation method which includes use of a spark, the temperature of the spark may exceed about 10,000 K. By using the cryogenic liquefied gas as a dielectric liquid medium, oxidization of the surface of the thermoelectric material particles due to the spark having a high temperature within this range may be minimized. Examples of the cryogenic liquefied gas include liquid nitrogen, liquid argon, and liquid helium.

Water may be suitable for rapidly cooling thermoelectric material particles. By using water as the dielectric liquid medium, a cooling rate of about $10^6$ Kelvin per second (K/sec) or more may be obtained. In addition, water can be suitable to increase a yield of thermoelectric material particles. For example, when Bi—Sb—Te-based thermoelectric material particles are prepared, water may be used as the dielectric liquid medium whereby a yield that is at least two times or at least four times greater than that when liquid nitrogen is used may be obtained.

Also, an organic solvent may be used as the dielectric liquid medium. For example, the organic solvent may comprise dodecane, ethyl acetate, or a combination thereof. Such organic solvents are advantageous in that they do not cause deterioration of the thermoelectric performance of the product due to oxidization of a surface of a thermoelectric material alloy, which can be a Bi—Te-based thermoelectric alloy.

In the method of preparing thermoelectric material particles, the thermoelectric material may be a bulk thermoelectric material, and may be, for example, a Bi—Sb alloy, an Sb—Te alloy, a Bi—Te alloy, a Bi—Sb—Te alloy, a Bi—Sb—Te—Se alloy, or a combination thereof.

In particular, the thermoelectric material may be represented by Formula 1: Formula 1

$$Bi_xSb_yTe_z,$$

wherein $0 \leq x \leq 2$, $y=2-x$, and $2.7 \leq z \leq 3.3$; specifically $0.001 \leq x \leq 1.999$, $y=2-x$, and $2.7 \leq z \leq 3.3$; more specifically $0.4 \leq x \leq 0.6$, $y=2-x$, and $2.7 \leq z \leq 3.3$; or $0.45 \leq x \leq 0.55$, $y=2-x$, and $2.8 \leq z \leq 3.2$.

The thermoelectric material, which may be a bulk thermoelectric material and which may be used as a raw material, and the thermoelectric material particles, which are the resulting product, may have compositions that are identical to or different from each other. For example, elements such as Te and the like that constitute a thermoelectric material have very high volatility, and thus, when being exposed to heat or strong mechanical impact, the thermoelectric material may have slightly changed raw material and composition. The deviation of a composition ratio of each element of the thermoelectric material particles from the composition ratio of the corresponding element of the bulk thermoelectric material lumps may be, for example, within about ±5 atomic percent (atomic %), based on the composition ratio of the corresponding element of the bulk thermoelectric material. For example, when the bulk thermoelectric material has a composition represented by Formula 1:

$$Bi_xSb_yTe_z, \hspace{2cm} \text{Formula 1}$$

the produced thermoelectric material nanoparticles may have a composition represented by Formula 2:

$$Bi_{x'}Sb_{y'}Te_{z'}, \hspace{2cm} \text{Formula 2}$$

wherein $x(1-0.05) \leq x' \leq x(1+0.05)$, $y(1-0.05) \leq y' \leq y(1+0.05)$, and $z(1-0.05) \leq z' \leq z(1+0.05)$.

The first and second electrodes may be in the form of an ingot obtained by melting and solidifying or an aggregate prepared by pressurizing or heat treating under pressure a thermoelectric material powder. Alternatively, the first and second electrodes may be formed from a bulk thermoelectric material which may be a crushed or broken ingot, for example.

The first and second electrodes may be, for example, in the form of a sphere, a disk, a rod, a flat plate, or a combination thereof. When the crushed ingot is used, the first and second electrodes may be in the form of an amorphous block.

The disposing (e.g., moving or rotating) of the first and second electrodes to which different electrical potentials are applied to cause spark therebetween may be performed by applying a voltage across two rotating disk electrodes, each consisting of a bulk thermoelectric material. FIG. 1 is a diagram illustrating an embodiment of a method of preparing thermoelectric particles using two rotating disk electrodes each consisting of a bulk thermoelectric material.

Referring to FIG. 1, a reactor 100 is filled with a dielectric liquid 200. First and second rotating disk electrodes 300 and 310, respectively, each comprising, e.g., formed of, the bulk thermoelectric material, are disposed in the dielectric liquid 200. The first and second rotating disk electrodes 300 and 310 are electrically connected to a power source 400, and an electric potential is continuously or intermittently applied to the first and second rotating disk electrodes 300 and 310. For example, the first rotating disk electrode 300 may be an anode and the second rotating disk electrode 310 may be a cathode, or vice versa. The first and the second rotating disk electrodes 300 and 310 may rotate in the same direction or different directions. In a sparking region 500, a point on a circumference of the first rotating disk electrode 300 and a point on a circumference of the second rotating disk electrode 310 approach each other within a sparking gap. Accordingly, a spark occurs between the point on a circumference of the first rotating disk electrode 300 and the point on a circumference of the second rotating disk electrode 310 that have entered the sparking region 500. A thermoelectric material at a sparking point on the circumference of each of the first and second rotating disk electrodes 300 and 310 vaporizes. The vaporized thermoelectric material is discharged from the sparking region 500 and thus pushed into the dielectric liquid 200. The vaporized thermoelectric material is cooled by the dielectric liquid 200, condensed, and solidified to form thermoelectric material particles 700. The thermoelectric material particles 700 sink and pass through a screen 600. The thermoelectric material particles 700 that have passed through the screen 600 accumulate on the bottom of the reactor 100. A material for forming the screen 600 is not particularly limited, and the screen 600 may filter particles that are intermittently formed and have a particle diameter of at least 1 micrometer (μm).

Figure 2:
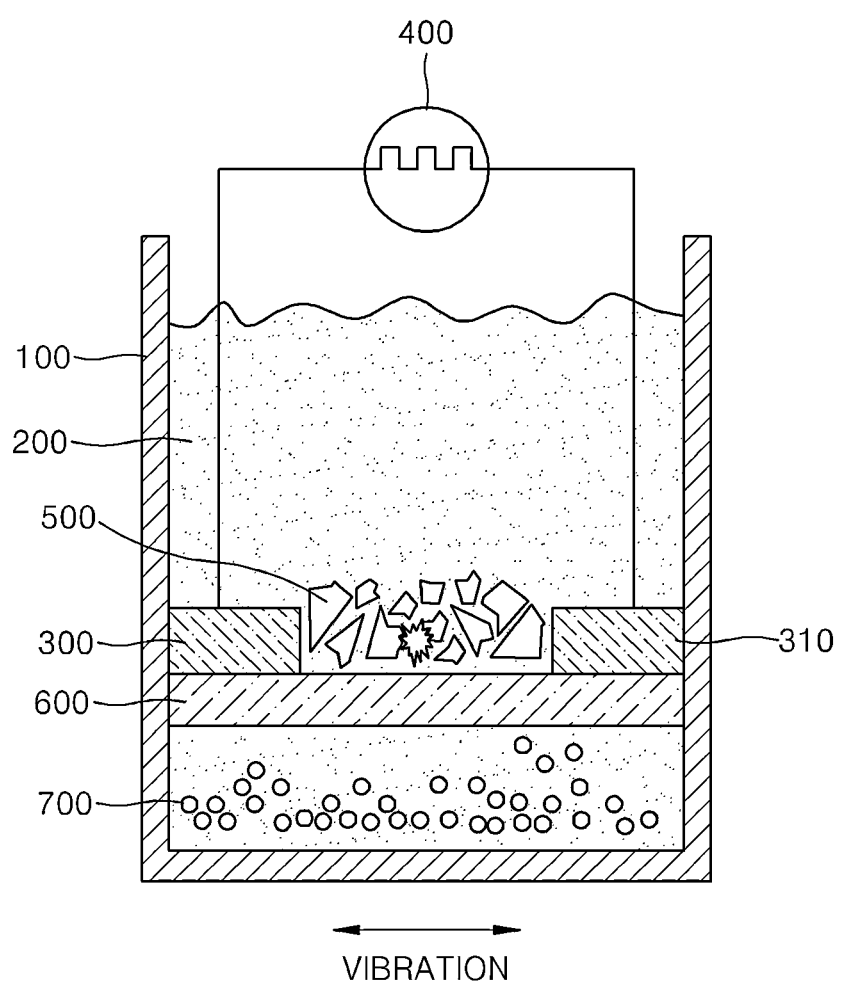
FIG. 2 is a diagram illustrating an embodiment of a method of preparing thermoelectric particles using a plurality of charge pieces disposed between a pair of electrodes that are spaced apart from each other.

The disposing of the first and second electrodes may be performed by vibrating a plurality of charge pieces disposed between a pair of electrodes that are spaced apart from each other, with respect to the first and second electrodes. In this regard, the first and second of electrodes that are spaced apart from each other may each comprise a bulk thermoelectric material, and the plurality of charge pieces may also comprise a bulk thermoelectric material. FIG. 2 is a diagram illustrating an embodiment of a method of preparing thermoelectric particles using a plurality of charge pieces disposed between first and second electrodes that are spaced apart from each other.

Referring to FIG. 2, a reactor 101 is filled with a dielectric liquid 200. First and second electrodes 400 and 410, which may comprise a bulk thermoelectric material, are spaced apart from each other in the dielectric liquid 200. The first and second electrodes 400 and 410 are electrically connected to a power source 400, and an electric potential is continuously or intermittently applied to the first and second electrodes 400 and 410. For example, the first and second electrodes 400 and 410 may be an anode and a cathode, respectively, or vice versa. A plurality of charge pieces 500, which may comprise a bulk thermoelectric material, are disposed between the first and second electrodes 400 and 410. A screen 600 is disposed below the plurality of charge pieces 500, which are disposed between the first and second electrodes 400 and 410. Accordingly, the charge pieces 500 are supported by the screen 600 and thus do not drop onto the bottom of the reactor 100. The reactor 101 may be, for example, a shaking reactor. A horizontal movement, a vertical movement, a rotational movement, or a combination thereof may be applied to the reactor 101. Accordingly, the charge pieces 500 vibrate with respect to the first and second electrodes 400 and 410, and thus, physical contact between the first and second electrodes 400 and 410, the charge pieces 500, may intermittently occur. In addition, different electric potentials may be also applied to the plurality of charge pieces 500, other than the first and second electrodes 400 and 410, through electrical contact by these intermittent physical contacts. Accordingly, right before and right after the physical contact between the first and second electrodes 400 and 410 and the charge pieces 500, a spark may occur among the first and second electrodes 400 and 410 and the charge pieces 500. A thermoelectric material vaporized from the first and second electrodes 400 and 410 and the charge pieces 500 is cooled by the dielectric liquid 200, condensed, and solidified to form thermoelectric material particles 701. The thermoelectric material particles 701 sink, pass through the screen 600, and then accumulate on the bottom of the reactor 101.

The moving of the first and second electrodes, to which an electric potential is applied to cause a spark therebetween may be performed using various members including two rotating disk electrodes and a plurality of charge pieces disposed between the electrodes that are spaced apart from each other.

In the method of preparing thermoelectric material particles, the electric potential may be applied from, for example, a direct current, alternating current, or pulse power source. In particular, an alternating current or pulse power source may be used. According an embodiment, when a voltage applied from the pulse power source is in a range of about 50 to about 400 volts (V) and a frequency of the power source is about 50 to about 60 Hertz (Hz), thermoelectric material particles having an average particle diameter of about 100 nm or less, specifically about 1 to about 100 nm, specifically about 2 to about 90 nm, more specifically about 4 to about 80 nm, may be effectively prepared. In particular, the electric potential may be applied from a capacitor. The capacitor may have a capacitance of about 5 to about 200 microFarads (μF), specifically about 10 to about 150 μF.

In the method of preparing thermoelectric material particles, produced thermoelectric material particles may include nanoparticles or nanoparticles and microparticles. The produced thermoelectric material nanoparticles may have an average particle diameter of about 10 nm to about 100 nm, for example, about 20 nm to about 40 nm. Each of the produced thermoelectric material microparticles may have a particle diameter of about 0.1 μm to about 10 μm, specifically about 0.5 μm to about 5 μm. In addition, the produced thermoelectric material microparticles have a nano-grained structure. As used herein, the term "grain" refers to a domain contained in a microparticle and not an independent particle. Accordingly, the produced thermoelectric material microparticles also have a nanoscale dimension in terms of lattice thermal conductivity.

In the method of preparing the thermoelectric material particles, at least one of the first and second electrodes may further include a filler, in addition to a thermoelectric material. In an embodiment, two-phase or multi-phase thermoelectric material particles including filler nanoparticles may be produced. The produced thermoelectric material particles may have a nano-composite structure.

At least one of the first and second electrodes including a filler may also include a thermoelectric material matrix; and filler particles dispersed in the thermoelectric material matrix. Examples of the filler particles include macroparticles, microparticles, nanoparticles, and a combination thereof. The filler macroparticles may have a diameter that is greater than about 100 μm, specifically about 100 to about 1000 μm. The filler microparticles may have a diameter of about 100 nm, specifically about 1 to about 200 μm. The filler nanoparticles may have a diameter of about 100 nm or less, specifically about 1 to about 100 nm.

The amount of the filler in an electrode further including a filler may be in a range of about 0.4 to about 20 wt %, for example, about 0.2 to about 5 wt %, based on a total weight of the electrode.

For example, the electrode further including a filler may be prepared by powder mixing a filler in the form of a powder, a fiber, or a flake and a thermoelectric material in the form of a powder, a fiber, or a flake to obtain a powder mixture and then pressing and sintering the powder mixture. Alternatively, the electrode further including a filler may be prepared by drilling bulk thermoelectric material lumps to form a hole and inserting a filler in the form of a rod or a wire into the hole. In addition, various other methods may be used to prepare the electrode.

The filler may comprise, for example, a ceramic or a metal. Examples of a ceramic filler include an oxide, a nitride, a fluoride, a carbide, and a combination thereof. In particular, the ceramic filler may comprise an oxide, nitride, fluoride or carbide of Na, Mg, K, Ca, Sc, Ti, V, Cr, Mn, Fe, Co, Ni, Cu, Zn, Ga, Ge, Sr, Y, Zr, Nb, Mo, Ru, In, Sn, Ba, La, Hf, Ta, W, Pb, Si, Ti, Al, or Mg, or a combination thereof. More particularly, the ceramic filler may comprise $SiO_2$, $TiO_2$, $Al_2O_3$, MgO, ZnO, SiC, BN, $Si_3N_4$, AlN, $CaF_2$, or a combination thereof. Examples of the metallic filler include Ag, Pd, Pt, Au, Ni, Si, Ge, Bi, Sb, Te, Se, an alloy thereof, or a combination thereof.

When a spark occurs between the electrodes further including a filler, the filler may also vaporize along with the thermoelectric material. The vaporized filler is cooled by the dielectric liquid, condensed, and solidified, together with the vaporized thermoelectric material. Through these processes, thermoelectric material nanoparticles or microparticles may be produced, and a thermoelectric material phase and a filler phase may coexist therein, and thus, a nanocomposite structure may be formed. In addition, the filler, i.e., filler phase, may be exposed on a surface of the thermoelectric material nanoparticles or the thermoelectric material microparticles.

Due to inclusion and exposure of the filler phase, the growth of nanoparticles or grains may be restricted in a subsequent process of preparing a sintered material of the method of preparing thermoelectric material nanoparticles by spark eroding. Accordingly, a particle diameter of the thermoelectric material particles including the filler phase may be at least about 20% or at least about 40% less than that of thermoelectric material particles not including the filler phase. Therefore, the thermoelectric material particles including the filler phase may exhibit phonon scattering effects that are at least about 20% or at least about 40% greater than that of the thermoelectric material particles not including the filler phase. Accordingly, the thermoelectric material particles including the filler phase may have a thermal conductivity that is at least about 20% or at least about 40% less than that of the thermoelectric material particles not including the filler phase. Accordingly, the thermoelectric material nanoparticles including the filler phase may exhibit a dimensionless figure of merit ZT that is at least about 10% or at least about 20% greater than that of the thermoelectric material particles not including the filler phase.

In the method of preparing the thermoelectric material particles, the dielectric liquid medium may further include a nano-dispersed filler or a dissolved filler.

When a spark occurs between the electrodes in the dielectric liquid medium, the filler in the dielectric liquid medium also vaporizes. Accordingly, the produced thermoelectric material particles may also include a filler phase, and thus, may have a nanocomposite structure.

The nano-dispersed filler may be, for example, ceramic or metal. Examples of a ceramic filler include an oxide, a nitride, a fluoride, a carbide, or a combination thereof. In particular, the ceramic filler may be an oxide, nitride, fluoride or carbide of Na, Mg, K, Ca, Sc, Ti, V, Cr, Mn, Fe, Co, Ni, Cu, Zn, Ga, Ge, Sr, Y, Zr, Nb, Mo, Ru, In, Sn, Ba, La, Hf, Ta, W, Pb, Si, Ti, Al, or Mg, or a combination thereof. More particularly, the ceramic filler may be $SiO_2$, $TiO_2$, $Al_2O_3$, MgO, ZnO, SiC, BN, $Si_3N_4$, AlN, $CaF_2$, or a combination thereof. Examples of the metallic filler include Ag, Pd, Pt, Au, Ni, Si, Ge, Bi, Sb, Te, Se, an alloy thereof, or a combination thereof. The nano-dispersed filler may have an average particle diameter of about 0.5 to about 50 nm, for example, about 1 to about 20 nm.

Examples of the dissolved filler include a metal chloride, metal nitrate, metal fluoride, or a combination thereof. In particular, the dissolved filler may be a chloride, nitrate or a fluoride of Na, Al, K, Mg, Fe, Ni, Co, Cr, V, Zr, or Hf, or a combination thereof.

The amount of the nano-dispersed filler or the dissolved filler in the dielectric liquid medium may be in a range of about 0.1 to about 10 volume percent (vol %), for example, about 0.2 to about 5 vol %, based on the total volume of the dielectric medium. When the amount of the nano-dispersed filler or the dissolved filler is greater than 10 vol %, the filler having thermoelectric properties that are lower than the improved effects of thermoelectric properties by the filler is present more than needed, and thus, the thermoelectric properties of the thermoelectric material nanoparticles may rather decrease.

Due to the inclusion of the filler phase by using the dielectric liquid medium further including a nano-dispersed filler or a dissolved filler, the growth of particles or grains may be restricted in a subsequent process of preparing a sintered material of the method of preparing thermoelectric material particles by spark eroding. Accordingly, a particle diameter of the thermoelectric material particles including the filler phase may be at least about 20% or at least about 40% less than that of thermoelectric material particles not including the filler phase. Therefore, the thermoelectric material particles including the filler phase may exhibit phonon scattering effects that are at least about 20% or at least about 40% greater than that of the thermoelectric material particles not including the filler phase. Accordingly, the thermoelectric material particles including the filler phase may have a thermal conductivity that is at least about 20% or at least about 40% less than that of the thermoelectric material particles not including the filler phase. Accordingly, the thermoelectric material particles including the filler phase may exhibit a dimensionless figure of merit ZT that is at least about 10% or at least about 20% greater than that of the thermoelectric material particles not including the filler phase.

According to another embodiment, a thermoelectric material powder includes thermoelectric material particles prepared by the method of preparing thermoelectric material particles.

According to another embodiment, a thermoelectric material powder includes thermoelectric material nanoparticles having an average particle diameter of about 10 nm to about 100 nm.

The thermoelectric material nanoparticles of the thermoelectric material powder may have an average particle diameter of about 20 nm to about 40 nm.

The thermoelectric material powder may further include thermoelectric material microparticles. Each thermoelectric material microparticle may have a particle diameter of about 0.1 µm to about 10 µm. The thermoelectric material microparticles have a nano-grained structure.

A thermoelectric material of the thermoelectric material powder may comprise, for example, a Bi—Sb alloy, an Sb—Te alloy, a Bi—Te alloy, a Bi—Sb—Te alloy, or a Bi—Sb—Te—Se alloy, or a combination thereof.

In particular, the thermoelectric material of the thermoelectric material powder may be represented by Formula 1:

$$Bi_xSb_yTe_z,$$

wherein $0 \leq x \leq 2$, $y=2-x$, and $2.7 \leq z \leq 3.3$; specifically $0.001 \leq x \leq 1.999$, $y=2-x$, and $2.7 \leq z \leq 3.3$; more specifically $0.4 \leq x \leq 0.6$, $y=2-x$, and $2.7 \leq z \leq 3.3$; or $0.45 \leq x \leq 0.55$, $y=2-x$, and $2.8 \leq z \leq 3.2$.

The thermoelectric material particles of the thermoelectric material powder may further include a filler. In an embodiment, the thermoelectric material microparticles of the thermoelectric material powder may further include a filler. Accordingly, the thermoelectric material nanoparticles or the thermoelectric material microparticles may each independently have a two-phase or multi-phase nanocomposite structure including filler nanoparticles. The amount of the filler in the thermoelectric material powder may be in a range of about 0.1 to about 20 wt %, for example, about 0.2 to about 5 wt %, based on the total weight of the thermoelectric material powder. When the amount of the filler is greater than 20 wt %, the thermoelectric properties of the thermoelectric material particles may decrease.

The filler may be, for example, a ceramic, a metal, or a combination thereof. Examples of a ceramic filler include an oxide, a nitride, a fluoride, a carbide, or a combination thereof. In particular, the ceramic filler may be an oxide, nitride, fluoride or carbide of Na, Mg, K, Ca, Sc, Ti, V, Cr, Mn, Fe, Co, Ni, Cu, Zn, Ga, Ge, Sr, Y, Zr, Nb, Mo, Ru, In, Sn, Ba, La, Hf, Ta, W, Pb, Si, Ti, Al, or Mg, or a combination thereof. More particularly, the ceramic filler may be $SiO_2$, $TiO_2$, $Al_2O_3$, MgO, ZnO, SiC, BN, $Si_3N_4$, AlN, $CaF_2$, or a combination thereof. Examples of the metallic filler include Ag, Pd, Pt, Au, Ni, Si, Ge, Bi, Sb, Te, Se, an alloy thereof, or a combination thereof. The filler phase may have an average particle diameter of about 0.5 to about 50 nm, for example, about 1 to about 20 nm.

The filler phase may be included in the thermoelectric material nanoparticles or the thermoelectric material microparticles. Also, the filler phase may be exposed on the surface of the thermoelectric material nanoparticles or the thermoelectric material microparticles.

Due to the inclusion and exposure of the filler phase, the growth of nanoparticles or grains may be restricted in a subsequent process of preparing a sintered material of the method of preparing the thermoelectric material particles by spark eroding. Accordingly, a particle diameter of the thermoelectric material particles including the filler phase may be at least about 20% or at least about 40% less than that of thermoelectric material particles not including the filler phase. Therefore, the thermoelectric material particles including the filler phase may exhibit phonon scattering effects that are at least about 20% or at least about 40% greater than that of the thermoelectric material particles not including the filler phase. Accordingly, the thermoelectric material particles including the filler phase may have a thermal conductivity that is at least about 20% or at least about 40% less than that of the thermoelectric material particles not including the filler phase. Accordingly, the thermoelectric material particles including the filler phase may exhibit a dimensionless figure of merit ZT that is at least about 10% or at least about 20% greater than that of the thermoelectric material particles not including the filler phase.

According to another embodiment, there is provided a method of preparing a sintered bulk thermoelectric material. The sintered bulk thermoelectric material is a bulk material obtained by sintering thermoelectric material particles, and may be used as a component of a thermoelectric material. The method of preparing a sintered bulk thermoelectric material includes compacting a thermoelectric material powder and sintering the compacted thermoelectric material powder.

The compacting process is performed to minimize a space between thermoelectric material particles so that the sintered bulk thermoelectric material has a desired density (e.g., at least about 95% of the theoretical density, specifically about 90% to about 99% of the theoretical density). For example, the compacting process may be performed by compression-molding a thermoelectric material powder using a press to form a thermoelectric material powder pellet. A pressure applied in the compacting process may be appropriately selected by considering the density of a desired sintered bulk thermoelectric material. For example, the pressure applied in the compacting process may be about 10 to about 200 megaPascals (MPa), for example, about 50 to about 100 MPa. In order for a thermoelectric material to exhibit desirable thermoelectric properties, a relative density thereof is desirably be greater than a certain level, e.g., greater than about 90% of a theoretical density, and a pressure of at least 10 MPa, for example, at least 50 MPa is can be used. An upper limit of the pressure is not particularly limited.

In the sintering process, the compacted thermoelectric material particles are consolidated. In this regard, the consolidation of the thermoelectric material particles may be performed such that a portion of a surface of a particle is combined with a portion of a surface of another particle. Therefore, the shape and size of the thermoelectric material particles after the sintering process are almost similar to those of the thermoelectric material particles before the sintering process. As a result of the sintering process, the sintered bulk thermoelectric material has a nano-grained structure derived from the thermoelectric material particles. Therefore, the sintered bulk thermoelectric material may maintain a nanoscale dimension in terms of a lattice thermal conductivity.

A sintering temperature of the sintering process may be less than a melting point of the thermoelectric material particles. The sintering temperature that is less than the melting point of the thermoelectric material particles may substantially or effectively prevent immediate and extensive consolidation between the thermoelectric material particles, whereby coarsening of the thermoelectric material particles may be suppressed. When the coarsening of the thermoelectric material particles occurs in the sintering process, the sintered bulk thermoelectric material may have an increased dimension in terms of a lattice thermal conductivity. If the sintering temperature is too low, a time taken for the sintering process may excessively increase. For example, as for a Bi—Sb—Te alloy-based thermoelectric material, the sintering temperature may be in a range of about 350° C. to about 500° C. Since the melting point of the Bi—Sb—Te alloy-based thermoelectric material is around about 580° C., a temperature of about 500° C. or below may be appropriate for the sintering process.

The sintering process may be performed in an inert atmosphere. The sintering process in an inert atmosphere may prevent undesired oxidization of the thermoelectric material nanoparticles. The inert atmosphere may be, for example, vacuum, an Ar atmosphere, a $N_2$ atmosphere, or a combination thereof.

A sintering time is a time taken to heat the compacted thermoelectric material particles at the sintering temperature. As the sintering time increases, a mechanical strength of the sintered bulk thermoelectric material may increase. For example, the sintering time may be a sufficient time for the sintering process so that the sintered bulk thermoelectric material has a desired strength. If the sintering time is too long, the thermoelectric material particles may be coarsened. For example, the sintering time may be about 1 minute to about 150 minutes, specifically about 1 minute to about 15 minutes.

The sintering process may be performed by, for example, spark plasma sintering (SPS). In the SPS process, a current passes through an electroconductive die filled with the thermoelectric material particles. Accordingly, the current also flows in the thermoelectric material particles contained in the electroconductive die. The electroconductive die may be, for example, graphite. The current may be, for example, a pulsed DC current. The SPS process enables the thermoelectric material particles to be rapidly heated and rapidly cooled. Thus, the thermoelectric material particles may be sintered by the SPS for a short period of time, e.g., about 0.5 to about 20 minutes, specifically about 1 to about 10 minutes, for example, about 1 to about 5 minutes. Therefore, the coarsening of the thermoelectric material particles may be suppressed.

In another embodiment, a time period of the compacting process and a time period of the sintering process may at least partially overlap with each other. In this embodiment, pressing to compact the thermoelectric material particles and heating to sinter the compacted thermoelectric material particles may be simultaneously performed. For example, this process may be performed by SPS whereby the thermoelectric material particles contained in the electroconductive die are pressed using a press with a current passing through the electroconductive die. When the compacting and sintering processes are simultaneously performed, a high-density sintered thermoelectric material may be obtained with a short period of time, and it is particularly advantageous in the formation of grain-sized nanoparticles (e.g., about 10 nm to about 100 nm) after the sintering process.

According to another embodiment, there is provided a sintered bulk thermoelectric material prepared by using the method of preparing a sintered bulk thermoelectric material.

According to another embodiment, there is provided a sintered bulk thermoelectric material that has an average particle diameter of about 10 nm to about 100 nm and a nanograined structure comprising thermoelectric material nanograins.

An average particle diameter of the thermoelectric material nanograins in the sintered bulk thermoelectric material may be about 20 nm to about 40 nm.

A thermoelectric material of the sintered bulk thermoelectric material may be, for example, a Bi—Sb alloy, an Sb—Te alloy, a Bi—Te alloy, a Bi—Sb—Te alloy, a Bi—Sb—Te—Se alloy, or a combination thereof.

In particular, the thermoelectric material of the sintered bulk thermoelectric material may be represented by Formula 1:

$Bi_xSb_yTe_z$, wherein 0≤x≤2, y=2−x, and 2.7≤z≤3.3; specifically 0.001≤x≤1.999, y=2−x, and 2.7≤z≤3.3; more specifically 0.4≤x≤0.6, y=2−x, and 2.7≤z≤3.3; or 0.45≤x≤0.55, y=2−x, and 2.8≤z≤3.2.

The thermoelectric material particles of the sintered bulk thermoelectric material may further include a filler phase. Accordingly, the sintered bulk thermoelectric material may have a two-phase or multi-phase nanocomposite structure including the filler phase. The amount of the filler phase in the sintered bulk thermoelectric material may be about 0.1 to about 20 wt %, for example, about 0.2 to about 5 wt %, based on the total weight of the sintered bulk thermoelectric material.

The filler may comprise, for example, a ceramic, a metal, or a combination thereof. Examples of a ceramic filler include an oxide, a nitride, a fluoride, a carbide, or a combination thereof. In particular, the ceramic filler may be an oxide, nitride, fluoride or carbide of Na, Mg, K, Ca, Sc, Ti, V, Cr, Mn, Fe, Co, Ni, Cu, Zn, Ga, Ge, Sr, Y, Zr, Nb, Mo, Ru, In, Sn, Ba, La, Hf, Ta, W, Pb, Si, Ti, Al, or Mg, or a combination thereof. More particularly, the ceramic filler may be $SiO_2$, $TiO_2$, $Al_2O_3$, MgO, ZnO, SiC, BN, $Si_3N_4$, AlN, $CaF_2$, or a combination thereof. Examples of a metallic filler include Ag, Pd, Pt, Au, Ni, Si, Ge, Bi, Sb, Te, Se, an alloy thereof, or a combination thereof. The filler phase may have an average particle diameter of about 0.5 to about 50 nm, for example, about 1 to about 20 nm.

An electrical conductivity of the sintered bulk thermoelectric material may be about 80% to about 120% of the electrical conductivity of a cast ingot of the thermoelectric material at about 300 K to about 530 K.

A thermal conductivity of the sintered bulk thermoelectric material may be about 30% to about 80% of the thermal conductivity of a cast ingot of the thermoelectric material at about 300 K to about 530 K.

The Seebeck coefficient of the sintered bulk thermoelectric material may be at least about 120%, for example, about 150% to about 300% of the Seebeck coefficient of the cast ingot of the thermoelectric material, at a temperature of 530K.

Accordingly, a dimensionless figure of merit ZT of the sintered bulk thermoelectric material may be about 120% to about 400% of that of the cast ingot of the thermoelectric material, at a temperature from about 300K to about 530K. Alternatively, the dimensionless figure of merit ZT of the sintered bulk thermoelectric material may be 0.5 or more at a temperature from about 300K to about 530K.

An embodiment will now be described more fully with reference to the following examples. However, these examples are provided only for illustrative purposes and are not intended to limit the scope.

EXAMPLES

Example 1

Preparation of $Bi_{0.5}Sb_{1.5}Te_3$ Nanoparticles

High-purity (99.999 wt % or more) Bi, Sb, and Te were weighed to an atomic ratio of 0.5:1.5:3. A cylinder-shaped quartz tube having an inner diameter of 38 mm and a length of 40 mm was filled with the weighed Bi, Sb, and Te. The quartz tube was vacuum sealed under $10^{-4}$ torr. The Bi, Sb, and Te contained in the quartz tube were melted and homogeneously mixed in a rocking furnace at 1073 K for 10 hours. The quartz tube was cooled at room temperature to obtain a Bi—Sb—Te ingot. The obtained Bi—Sb—Te ingot was cut in half to obtain two semi-cylinder shaped electrodes each having a diameter of 38 mm and a length of 40 mm. A Bi—Sb—Te ingot prepared using the same method as described above was crushed to obtain a plurality of charge pieces having an average particle diameter of about 20 mm.

A shaking reactor as illustrated in FIG. 2 was configured as follows. An electrically insulating and perforated screen (10 μm, polyethylene) was placed in a glass reaction container having an inner diameter of 100 mm and a height of 200 mm. The screen was spaced apart from the bottom of the reaction container by 50 mm. Two electrodes were fixed separately on the screen. The plurality of charge pieces were disposed between the two electrodes. The reaction container configured in this manner was put in a double-walled, vacuum-jacketed glass container. The two electrodes were connected to a capacitor (200V, 80 μF capacitor). The capacitor was connected to a power supply. The reaction container was filled with liquid nitrogen so that both the electrodes and the charge pieces were covered thereby.

Then, as the capacitor operated, a spark occurred in a simultaneous and disordered manner at a plurality of contact points by intermittent physical and electrical contact between the charge pieces and intermittent physical and electrical contact between the charge pieces and the electrodes. The occurrence of the spark was maintained for 1 minute.

Afterwards, thermoelectric material particles that accumulated on the bottom of the reaction container were collected. The collected thermoelectric material particles were sieved to remove coarse particles separated from the electrodes and the charge pieces. The obtained thermoelectric material particles were stored in an inert atmosphere ($N_2$).

FIGS. 3A and 3B are scanning electron microscopic (SEM) images of $Bi_{0.5}Sb_{1.5}Te_3$ alloy nanoparticles prepared according to Example 1. In detail, FIG. 3A is an SEM image of a portion of the $Bi_{0.5}Sb_{1.5}Te_3$ alloy nanoparticles of Example 1, and FIG. 3B is an SEM image of another portion of the $Bi_{0.5}Sb_{1.5}Te_3$ alloy nanoparticles of Example 1. Referring to FIG. 3A, although there are big chunks in some regions, most particles have a particle diameter of 10 nm to 30 nm. On the other hand, referring to FIG. 3B, only a plurality of nanoparticles having a particle diameter of 10 nm to 30 nm are shown.

Figure 3:
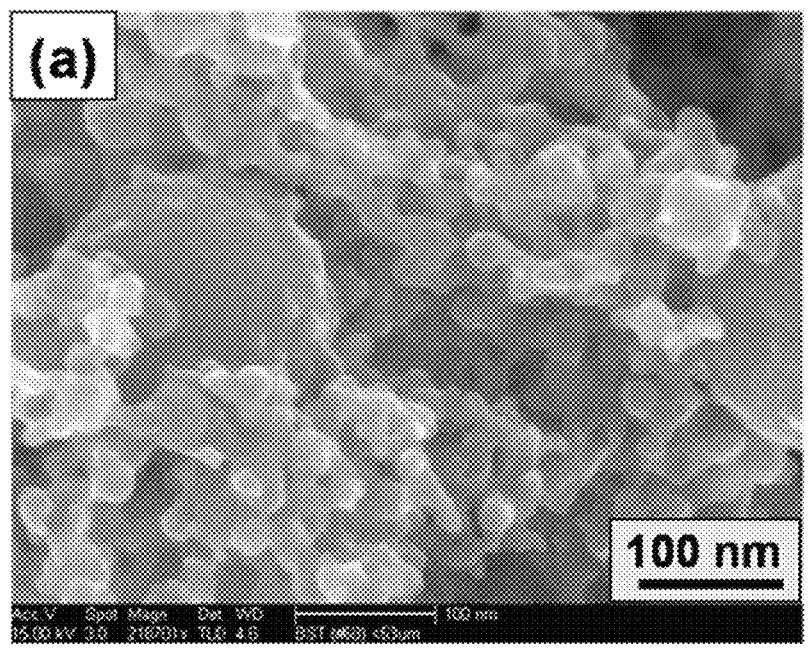
FIGS. 3A and 3B are scanning electron microscopic (SEM) images of $Bi_{0.5}Sb_{1.5}Te_3$ alloy nanoparticles prepared according to Example 1.
Figure 3:
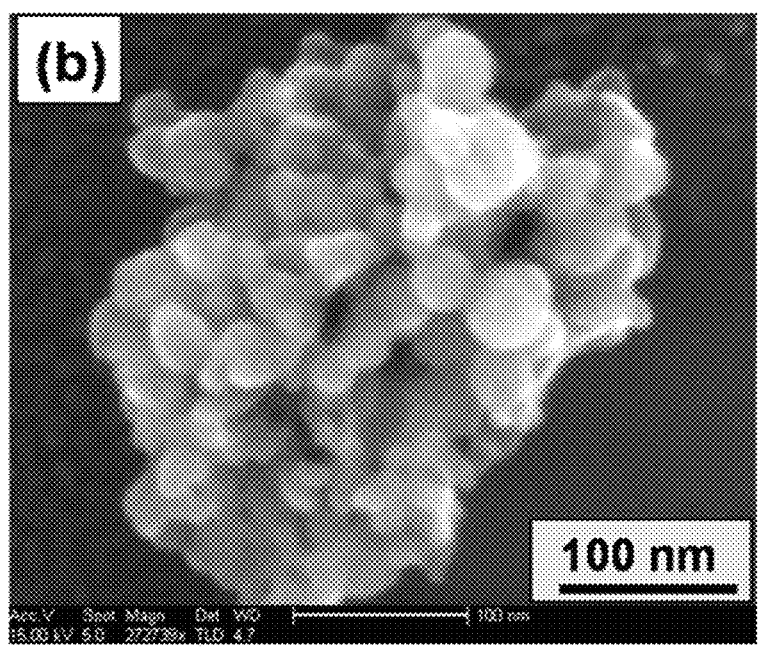

As seen in FIG. 3, it is confirmed that thermoelectric material nanoparticles may be effectively prepared by using a preparation method according to an embodiment. As illustrated in FIG. 3A, the prepared thermoelectric material particles may include a small amount of macroparticles. These macroparticles may be easily removed through, for example, various particle sizing processes such as sieving. However, these macroparticles can be retained since they have a nano-grained structure.

Figure 4:
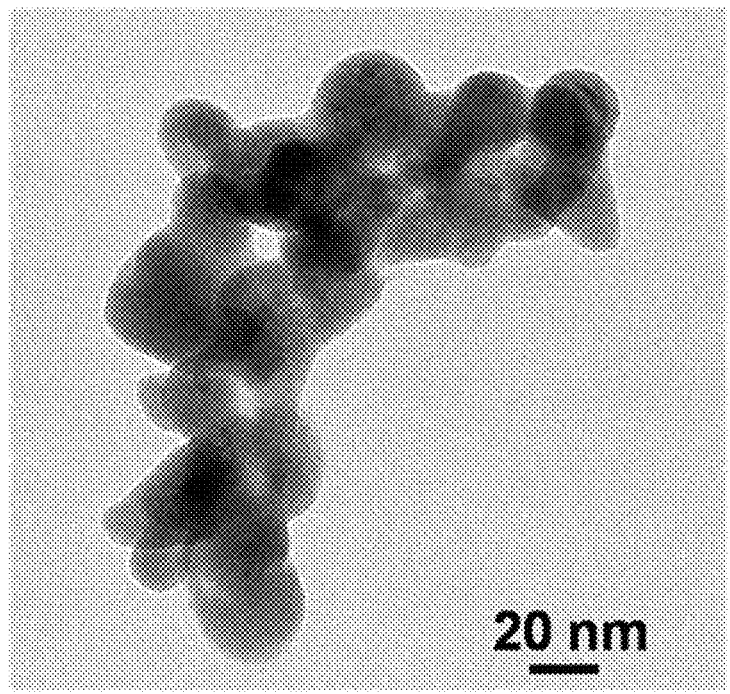
FIG. 4 is a transmission electron microscopic (TEM) image of the $Bi_{0.5}Sb_{1.5}Te_3$ alloy nanoparticles of Example 1.
Figure 5:
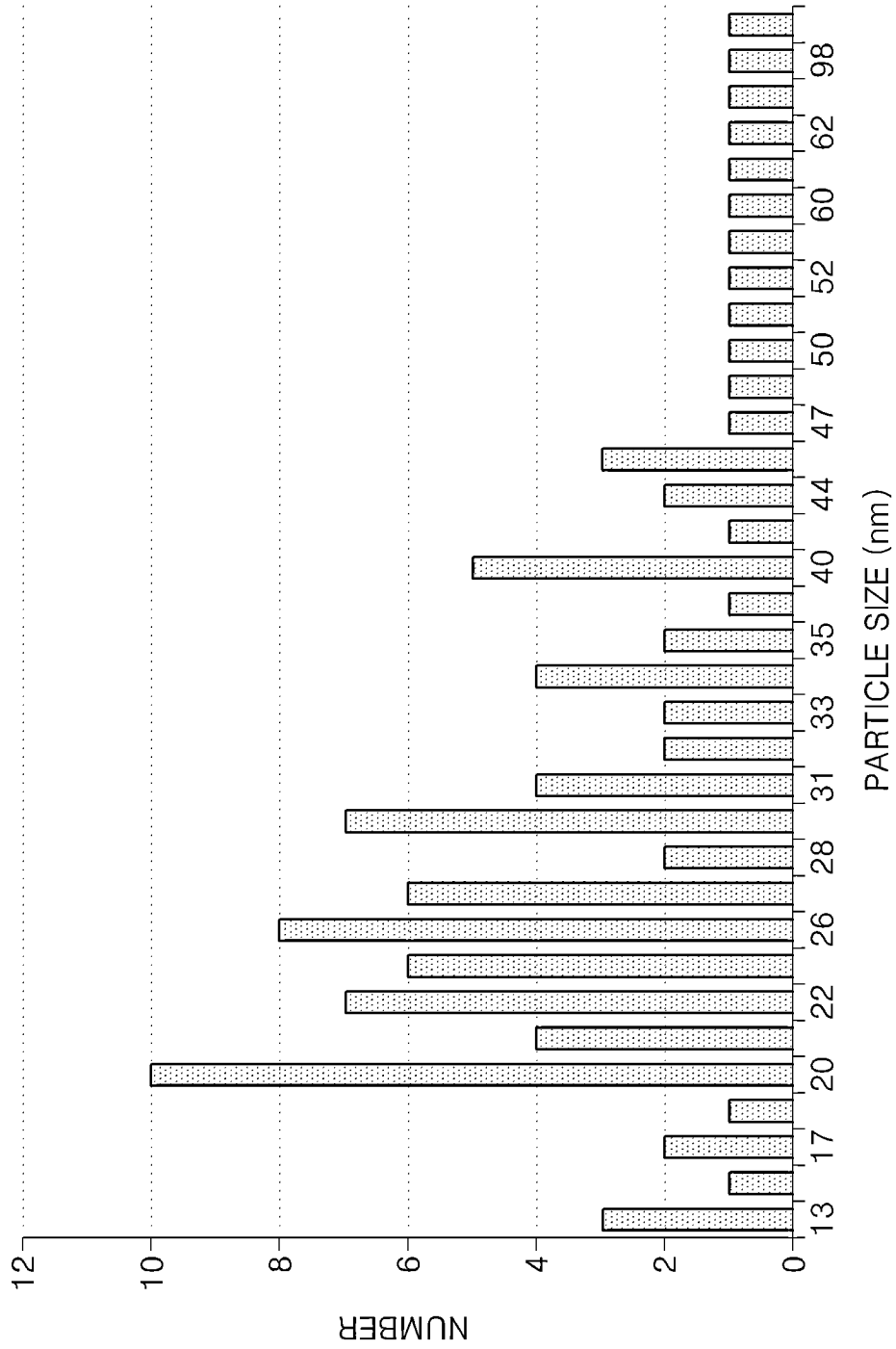
FIG. 5 is a graph of number versus particle size (nanometers, m) showing a particle size distribution of the $Bi_{0.5}Sb_{1.5}Te_3$ alloy of Example 1.

FIG. 4 is a transmission electron microscopic (TEM) image of $Bi_{0.5}Sb_{1.5}Te_3$ alloy nanoparticles prepared according to Example 1. Referring to FIG. 4, it is more clearly confirmed that the $Bi_{0.5}Sb_{1.5}Te_3$ alloy nanoparticles of Example 1 have a particle diameter of 10 nm to 30 nm. FIG. 5 is a graph showing particle size distribution of the $Bi_{0.5}Sb_{1.5}Te_3$ alloy nanoparticles of Example 1. As shown in FIG. 5, the $Bi_{0.5}Sb_{1.5}Te_3$ alloy nanoparticles of Example 1 have an average particle diameter of 25 nm.

Figure 6:
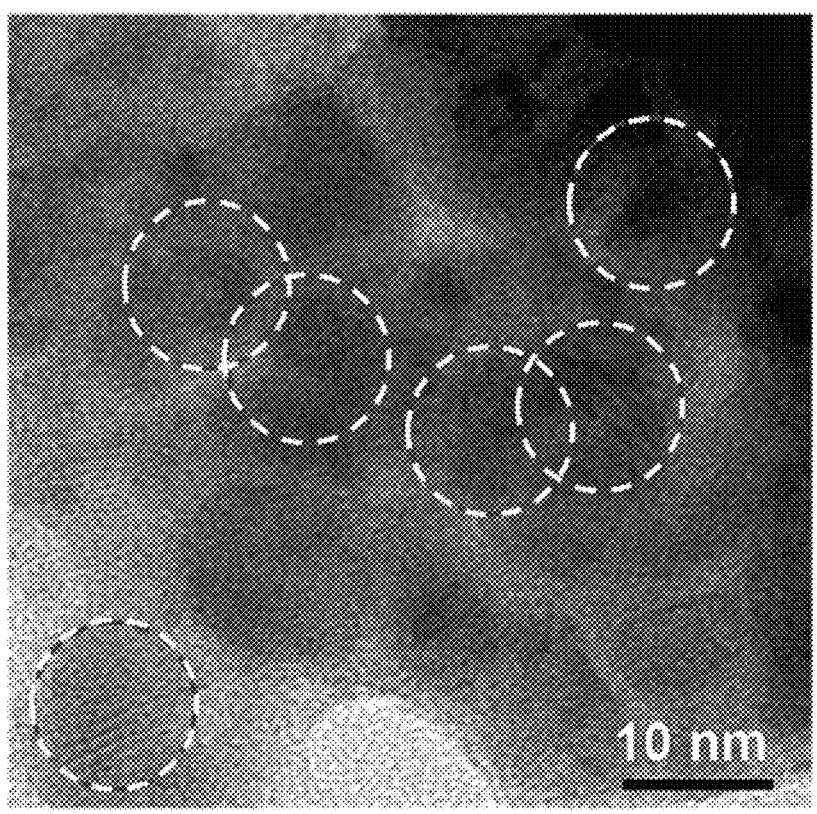
FIG. 6 is a TEM image of microparticles included in $Bi_{0.5}Sb_{1.5}Te_3$ alloy nanoparticles of Example 1.

FIG. 6 is a TEM image of microparticles included in the $Bi_{0.5}Sb_{1.5}Te_3$ alloy nanoparticles of Example 1. As shown in FIG. 6, the microparticles exhibit a nano-grained structure as an inner grain structure. That is, the microparticles of FIG. 6 include nano-grains having a grain size of 10 nm to 20 nm. Accordingly, the microparticles of FIG. 6 exhibit significantly improved phonon scattering effects, which lead to greatly decreased lattice thermal conductivity, resulting in a largely improved dimensionless figure of merit ZT.

Example 2

Preparation of Sintered Bulk Thermoelectric Material

The $Bi_{0.5}Sb_{1.5}Te_3$ alloy nanoparticles of Example 1 were sintered to obtain a sintered bulk thermoelectric material. First, millimeter-sized chunks were removed from the $Bi_{0.5}Sb_{1.5}Te_3$ alloy nanoparticles of Example 1 by using a 53 micron size sieve. The resultant $Bi_{0.5}Sb_{1.5}Te_3$ alloy nanoparticles were sintered by SPS. The sintering conditions were as follows: at 0.001 torr in vacuum; at a sintering temperature of 450° C.; at a press pressure of 90 MPa; heating from room temperature to 450° C. for 5 minutes and then maintaining the temperature of 450° C. for 1 minute.

Figure 7:
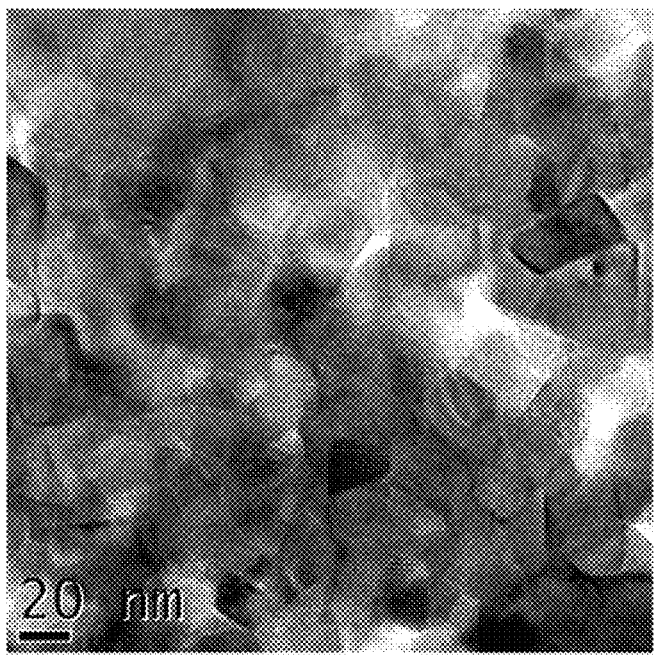
FIGS. 7A and 7B are TEM images of a sintered bulk thermoelectric material prepared according to Example 2.
Figure 7:
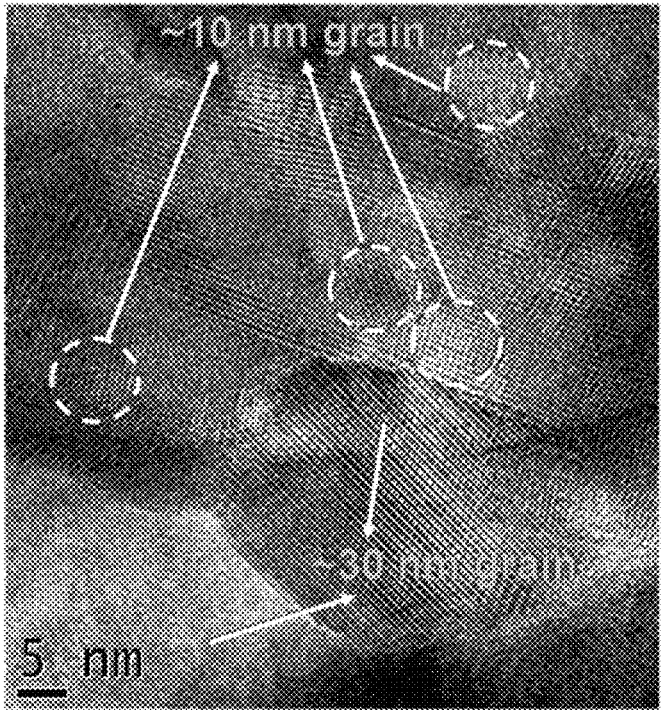

FIGS. 7A and 7B are TEM images of a sintered bulk thermoelectric material prepared according to Example 2. FIG. 7A is a low magnification image and FIG. 7B is a high magnification image. As shown in FIGS. 7A and 7B, the sintered bulk thermoelectric material of Example 2 has a nano-grained structure containing nano-grains having a particle diameter of 10 nm to 50 nm. While not wanting to be bound by theory, it is understood that the ultrafine grain size plays a significant role in reducing thermal conductivity for an improved dimensionless figure of merit ZT.

Example 3

Preparation of Disk-Type Sintered Bulk Thermoelectric Material

A disk-type sintered bulk thermoelectric material having a diameter of 10 mm and a thickness of 13 mm was prepared in the same manner as in Example 2. The density of the sintered bulk thermoelectric material was 6.67 g/cm$^3$ at a normal state (20° C., 1 atm, and a relative humidity of 65%), which corresponds to at least 97% of the theoretical density. The sintered bulk thermoelectric material was cut along a plane parallel to a press direction, and the resultant sintered bulk thermoelectric material was used as a disk sample (diameter: 10 mm, thickness: 1 mm) for measuring thermal diffusivity. The sintered bulk thermoelectric material was cut along a plane perpendicular to the press direction, and the resulting material was used as a rod sample (2 mm×2 mm×8 mm) for measuring carrier transport properties and the Seebeck coefficient.

Comparative Example 1

Preparation of Cast Thermoelectric Material Ingot Sample

High-purity (99.999 wt % or more) Bi, Sb, and Te were weighed to an atomic ratio of 0.5:1.5:3. A cylinder-shaped quartz tube having an inner diameter of 10 mm and a length of 150 mm was filled with the weighed Bi, Sb, and Te. The quartz tube was vacuum sealed under $10^{-4}$ torr. The Bi, Sb, and Te contained in the quartz tube were melted and homogeneously mixed in a rocking furnace at 1073 K for 10 hours.

The quartz tube was cooled at room temperature to obtain a Bi—Sb—Te ingot. The cylinder-shaped Bi—Sb—Te ingot was cut along a plane perpendicular to an axial direction thereof, and the resultant ingot was used as a disk sample (diameter: 10 mm, thickness: 1 mm) for measuring thermal diffusivity. The cylinder-shaped Bi—Sb—Te ingot was cut along the axial direction, and the resultant ingot was used as a rod sample (2 mm×2 mm×8 mm) for measuring carrier transport properties and the Seebeck coefficient.

Comparative Example 2

Preparation of Mechanically Ground Sintered Bulk Thermoelectric Material

A $Bi_{0.5}Sb_{1.5}Te_3$ ingot was prepared in the same manner as in Comparative Example 1. The $Bi_{0.5}Sb_{1.5}Te_3$ ingot was ground using a planetary ball mill in a nitrogen atmosphere at 200 rpm for 10 hours. A stainless steel container and stainless balls having a diameter of 5 mm were used. A weight ratio of the balls to a powder was 10:1. The ball milled powder was sieved to obtain particles having a diameter of 45 μm or less. The obtained particles were sintered by SPS to obtain a disk-type sintered bulk thermoelectric material (diameter: 10 mm, thickness: 13 mm). The sintering conditions were as follows: at 0.001 torr in vacuum; at a sintering temperature of 450° C.; at a press pressure of 50 MPa; a sintering time of 3 minutes. The density of the sintered bulk thermoelectric material accounted for 98% of the theoretical density. The sintered bulk thermoelectric material was cut along a plane parallel to a press direction, and the resultant material was used as a disk sample (diameter: 10 mm, thickness: 1 mm) for measuring thermal diffusivity. The sintered bulk thermoelectric material was cut along a plane perpendicular to the press direction, and the resultant material was used as a rod sample (2 mm×2 mm×8 mm) for measuring carrier transport properties and the Seebeck coefficient.

The electrical conductivity of the sintered bulk thermoelectric material was measured using a DC 4-probe method. The Seebeck coefficient thereof was measured using a steady state method in which temperature differences of 10° C., 20° C., and 30° C. were applied to both ends of a sample and electromotive force differences generated under these conditions were measured. The thermal conductivity of the sintered bulk thermoelectric material was calculated by the following expression: thermal diffusivity×heat capacity×density. The thermal diffusivity was measured using a laser flash method. The heat capacity was measured using a thermal relaxation method. The density was calculated by measuring volume and weight. A power factor of the sintered bulk thermoelectric material was calculated by the following expression: electrical conductivity×(Seebeck coefficient)$^2$.

Figure 8:
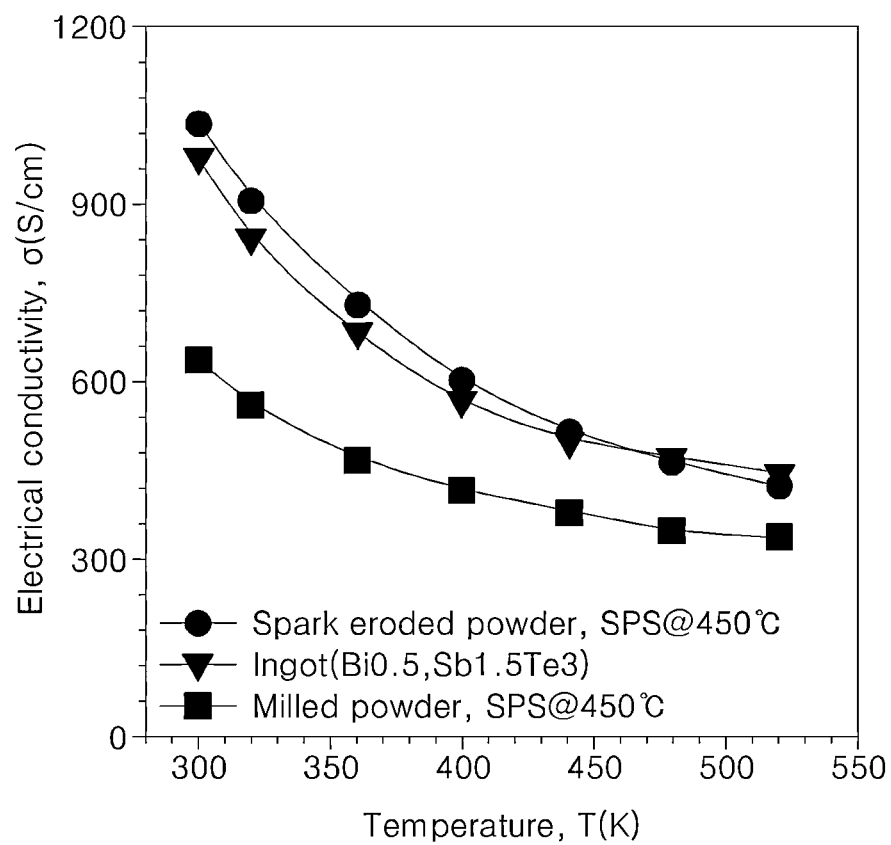
FIG. 8 is a graph of electrical conductivity (Siemens per centimeter) versus temperature (Kelvin, K) showing changes in electrical conductivity according to temperature of a sintered bulk thermoelectric material prepared according to Example 3 (by spark eroding and sintering), a thermoelectric ingot prepared according to Comparative Example 1, and a sintered bulk thermoelectric material prepared according to Comparative Example 2 (by mechanical grinding and sintering)

FIG. 8 is a graph showing changes in electrical conductivity according to temperature of a sintered bulk thermoelectric material prepared according to Example 3 (by spark eroding and sintering), a thermoelectric material ingot prepared according to Comparative Example 1, and a sintered bulk thermoelectric material prepared according to Comparative Example 2 (by mechanical grinding and sintering). As shown in FIG. 8, the electrical conductivity of the sintered bulk thermoelectric material of Comparative Example 2 was much lower than that of the thermoelectric material ingot of Comparative Example 1 over the entire temperature range. This is assumed because the thermoelectric material particles used in the sintered bulk thermoelectric material of Comparative Example 2 were surface-oxidized in the ball mill process performed for a long period of time and contaminated by a grinding ball (stainless steel) abraded in the ball mill process. On the other hand, the sintered bulk thermoelectric material of Example 3 exhibited a similar or higher electrical conductivity to or than that of the thermoelectric material ingot of Comparative Example 1 over the entire temperature range. The electrical conductivity of the sintered bulk thermoelectric material of Example 3 is much higher than that of the sintered bulk thermoelectric material of Comparative Example 2 and higher even than that of the thermoelectric material ingot of Comparative Example 1.

Figure 9:
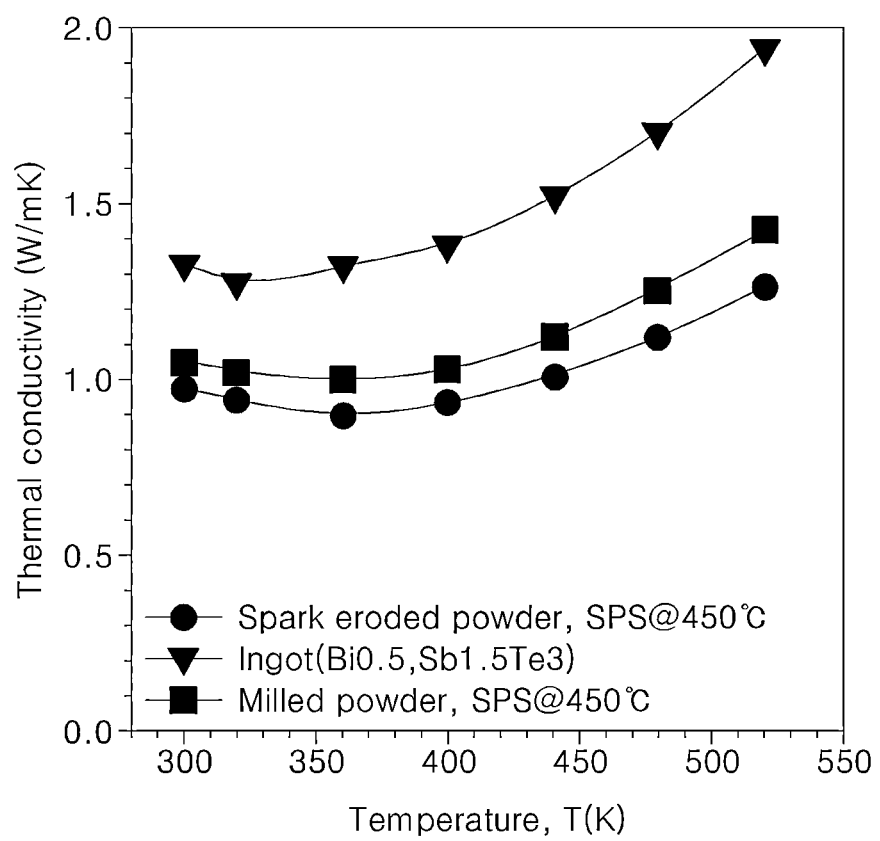
FIG. 9 is a graph of thermal conductivity (Watts per meter-Kelvin) versus temperature (Kelvin, K) showing changes in overall thermal conductivity according to temperature of the sintered bulk thermoelectric material of Example 3 (by spark eroding and sintering), the thermoelectric ingot of Comparative Example 1, and the sintered bulk thermoelectric material of Comparative Example 2 (by mechanical grinding and sintering)

FIG. 9 is a graph showing changes in overall thermal conductivity according to temperature of the sintered bulk thermoelectric material of Example 3 (by spark eroding and sintering), the thermoelectric material ingot of Comparative Example 1, and the sintered bulk thermoelectric material of Comparative Example 2 (by mechanical grinding and sintering). As shown in FIG. 9, the thermal conductivity of the sintered bulk thermoelectric material of Example 3 was at least 30% less than that of the thermoelectric material ingot of Comparative Example 1 over the entire temperature range. Moreover, the thermal conductivity of the sintered bulk thermoelectric material of Example 3 was at least 20% less than that of the sintered bulk thermoelectric material of Comparative Example 2. The thermal conductivity of the sintered bulk thermoelectric material of Comparative Example 2 was lower than that of the thermoelectric material ingot of Comparative Example 1, but was much higher than that of the sintered bulk thermoelectric material of Example 3.

Figure 10:
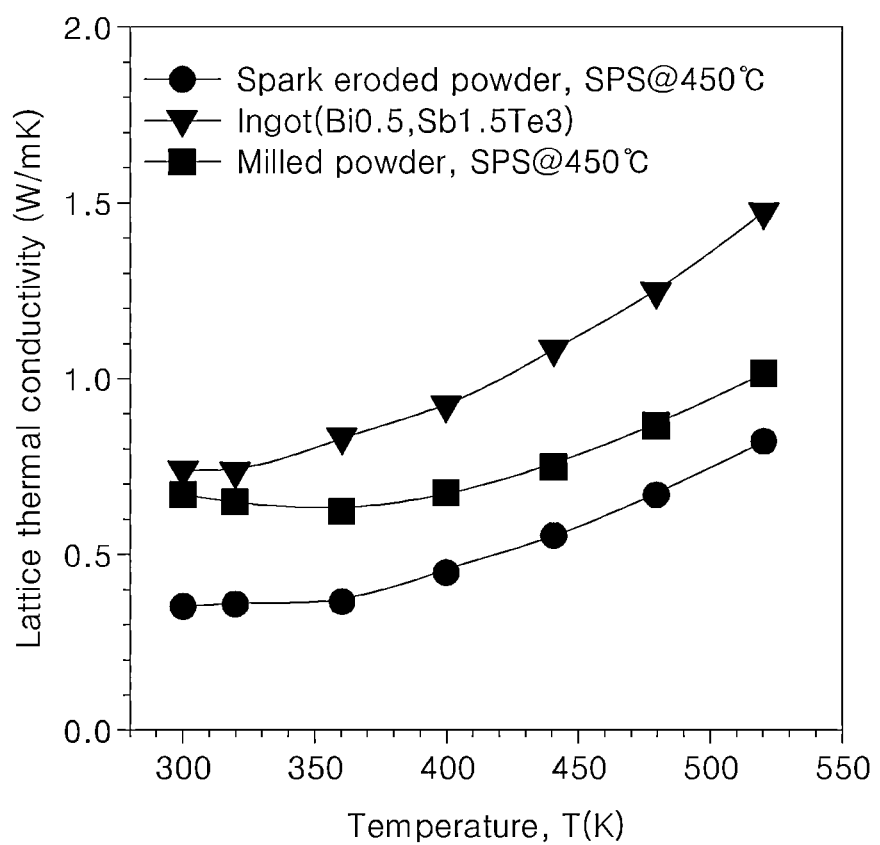
FIG. 10 is a graph of lattice thermal conductivity (Watts per meter Kelvin) versus temperature (Kelvin, K) showing changes in lattice thermal conductivity according to temperature of the sintered bulk thermoelectric material of Example 3 (by spark eroding and sintering), the thermoelectric ingot of Comparative Example 1, and the sintered bulk thermoelectric material of Comparative Example 2 (by mechanical grinding and sintering)

The lattice thermal conductivity is part of the overall thermal conductivity. FIG. 10 is a graph showing changes in lattice thermal conductivity according to temperature of the sintered bulk thermoelectric material of Example 3 (by spark eroding and sintering), the thermoelectric material ingot of Comparative Example 1, and the sintered bulk thermoelectric material of Comparative Example 2 (by mechanical grinding and sintering). As shown in FIG. 10, the lattice thermal conductivity of the sintered bulk thermoelectric material of Example 3 was much lower than those of the thermoelectric material ingot of Comparative Example 1 and the sintered bulk thermoelectric material of Comparative Example 2. As described above, the lattice thermal conductivity represents increased phonon scattering effects derived from a nano-grained structure of the sintered bulk thermoelectric material and the related defects.

Figure 11:
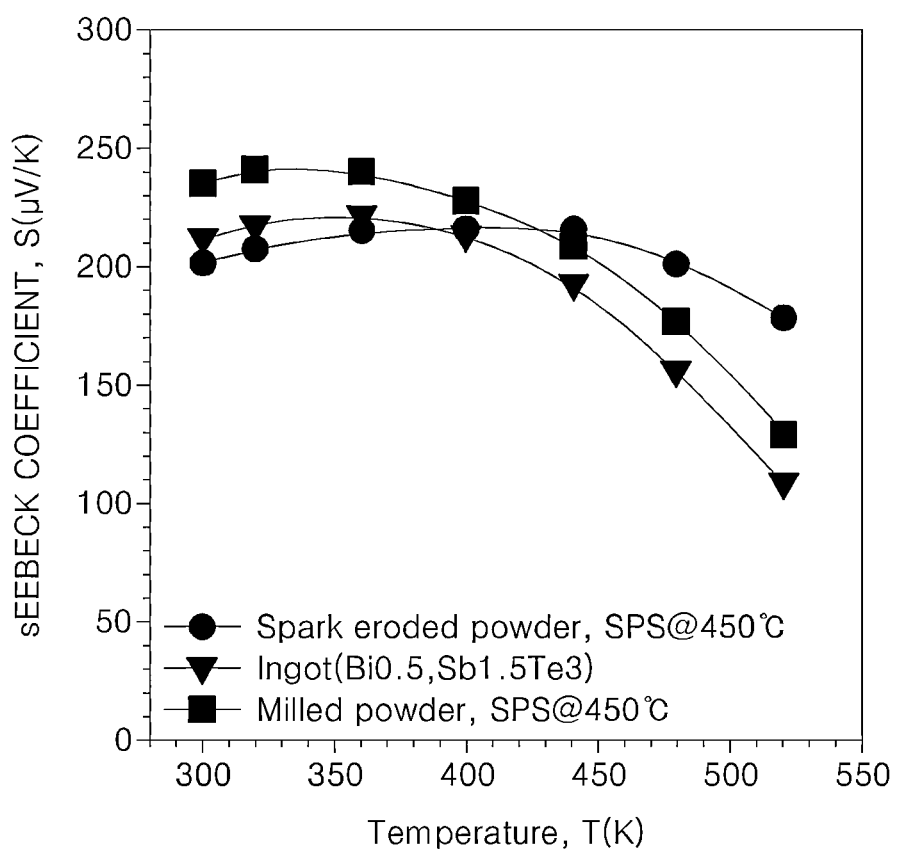
FIG. 11 is a graph of Seebeck coefficient (microvolts per Kelvin, μV/K) versus temperature (Kelvin, K) showing changes in the Seebeck coefficient according to temperature of the sintered bulk thermoelectric material of Example 3 (by spark eroding and sintering), the thermoelectric ingot of Comparative Example 1, and the sintered bulk thermoelectric material of Comparative Example 2 (by mechanical grinding and sintering)

FIG. 11 is a graph showing changes in the Seebeck coefficient according to temperature of the sintered bulk thermoelectric material of Example 3 (by spark eroding and sintering), the thermoelectric material ingot of Comparative Example 1, and the sintered bulk thermoelectric material of Comparative Example 2 (by mechanical grinding and sintering). As shown in FIG. 11, the Seebeck coefficient of the sintered bulk thermoelectric material of Example 3 was lower than that of the thermoelectric material ingot of Comparative Example 1 at low temperatures and the sintered bulk thermoelectric material of Comparative Example 2, while the Seebeck coefficient of the sintered bulk thermoelectric material of Example 3 was much higher than that of the thermoelectric material ingot of Comparative Example 1 at low temperatures and the sintered bulk thermoelectric material of Comparative Example 2 at high temperatures of 450K or more. Moreover, a variance in the Seebeck coefficients according to temperature of the sintered bulk thermoelectric material of Example 3 was a lot lower than that of the thermoelectric material ingot of Comparative Example 1 at low temperatures and the sintered bulk thermoelectric material of Comparative Example 2. An existing commercially available thermoelectric material exhibits a significantly decreased Seebeck coefficient according to a temperature increase, and thus, has a largely decreased dimensionless figure of merit ZT at high temperatures (i.e., 400K or more). A small variance in the Seebeck coefficients according to temperature means that the Seebeck coefficient is maintained high even at high temperatures and thus the thermoelectric material may exhibit high thermoelectric performances.

Figure 12:
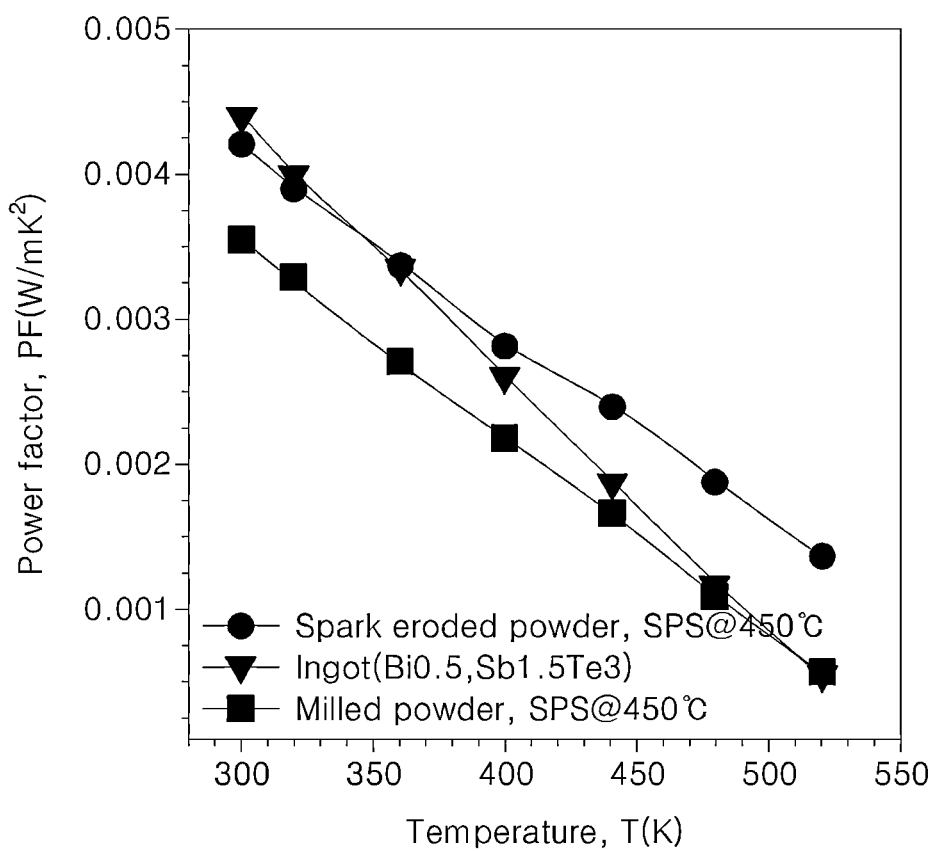
FIG. 12 is a graph of power factor (Watts per meter-square Kelvin, $W/mK^2$) versus temperature (Kelvin, K) showing changes in power factor according to temperature of the sintered bulk thermoelectric material of Example 3 (by spark eroding and sintering), the thermoelectric ingot of Comparative Example 1, and the sintered bulk thermoelectric material of Comparative Example 2 (by mechanical grinding and sintering)

FIG. 12 is a graph showing changes in power factor according to temperature of the sintered bulk thermoelectric material of Example 3 (by spark eroding and sintering), the thermoelectric material ingot of Comparative Example 1, and the sintered bulk thermoelectric material of Comparative Example 2 (by mechanical grinding and sintering).

Figure 13:
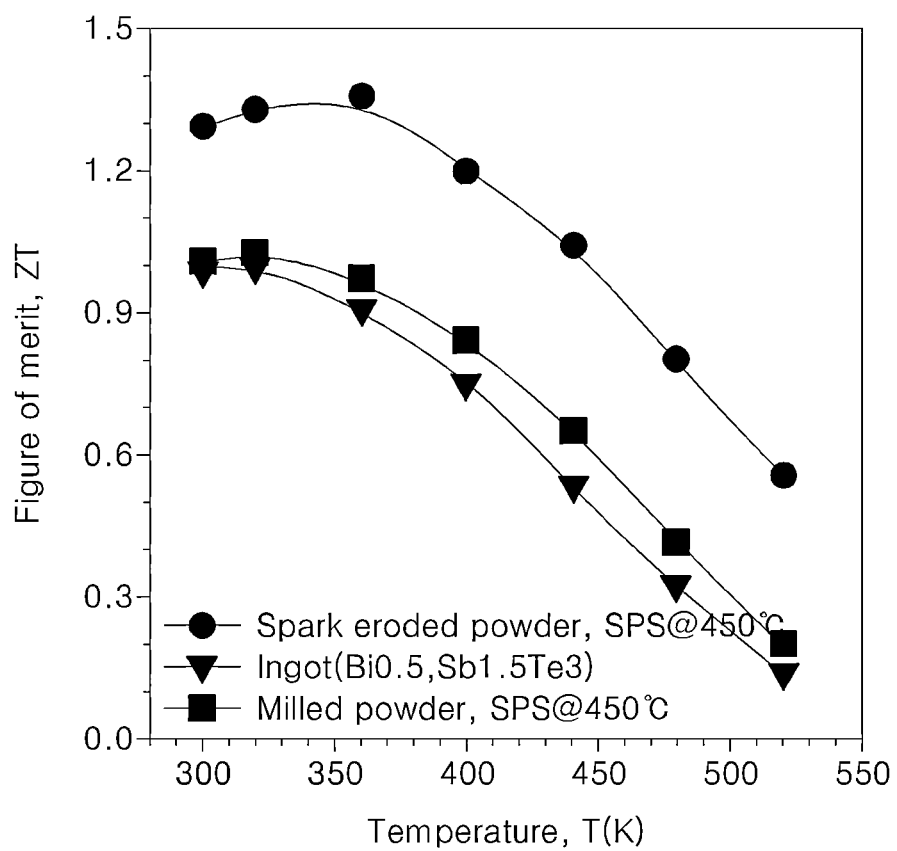
FIG. 13 is a graph of Figure of Merit (ZT) versus temperature (Kelvin, K) showing changes in a dimensionless figure of merit ZT according to temperature of the sintered bulk thermoelectric material of Example 3 (by spark eroding and sintering), the thermoelectric ingot of Comparative Example 1, and the sintered bulk thermoelectric material of Comparative Example 2 (by mechanical grinding and sintering).

The dimensionless figure of merit ZT is calculated by the following expression: $ZT=T[S^2\sigma/k]$, where T is an operating temperature, S is the Seebeck coefficient [in Volts/degree K], σ is electrical conductivity [in 1/Ω-meter], and k is thermal conductivity [in Watts/meter-degree K]. FIG. 13 is a graph showing changes in a dimensionless figure of merit ZT according to temperature of the sintered bulk thermoelectric material of Example 3 (by spark eroding and sintering), the thermoelectric ingot of Comparative Example 1, and the sintered bulk thermoelectric material of Comparative Example 2 (by mechanical grinding and sintering). As shown in FIG. 13, the dimensionless figure of merit ZT of the sintered bulk thermoelectric material of Example 3 was greater than that of the thermoelectric ingot of Comparative Example 1 and the sintered bulk thermoelectric material of Comparative Example 2 by at least 20% over the entire temperature range. The maximum ZT value was 1.36 at 370K. Such a significant improvement is attributed to the formation of the nano-grained structure of the sintered bulk thermoelectric material of Example 3 and defects by spark eroding.

According to an embodiment, when a gap between electrodes comprising a thermoelectric material and between which an electric potential is applied is sufficiently small, an electric field that is higher than a dielectric breakdown potential of the dielectric liquid medium is formed, and thus, a spark occurs therebetween. Alternatively, when different electric potentials are applied to two bulk thermoelectric material lumps in a state in which a gap therebetween is sufficiently small, an electric field that is higher than a dielectric breakdown potential of the dielectric liquid medium is formed, and thus, a spark occurs between the two bulk thermoelectric material lumps. A sparking gap may be formed immediately before or immediately after, for example, instantaneous physical contact between the two bulk thermoelectric material lumps.

Spark is micro-plasma consisting of electrons and positive ions. Such micro-plasma is very hot (i.e., approximately 10,000K). A kinetic energy of the electrons and the positive ions of the micro-plasma is transmitted to a localized region at a sparking point on a surface of two bulk thermoelectric material lumps. Thus, a thermoelectric material of the localized region is heated to vaporize.

For example, when the formed spark disappears due to an increase in the gap between the two bulk thermoelectric material lumps or blocking of the electric potentials applied thereto, a vaporized or melted thermoelectric material is vigorously discharged from a region on which plasma has been formed to be pushed into the dielectric liquid medium. Accordingly, the vaporized or melted thermoelectric material is rapidly cooled by the dielectric liquid medium. Through the cooling process, the vaporized thermoelectric material is condensed and solidified to form thermoelectric material nanoparticles. On contrary to this, melted thermoelectric material droplets are cooled to form micro-sized particle. Because of a very rapid cooling rate, micro-sized thermoelectric material particles may have a very small grain size. The condensed vapor or melted droplets of the thermoelectric material tend(s) to be formed as a nanocrystalline material and is(are) in the form of spherical particles. The formed particles sink and accumulate on the bottom of a reactor.

As a dimensionless figure of merit ZT ($=S^2\sigma T/k$) of a thermoelectric material increases, the thermoelectric material is very applicable. The dimensionless figure of merit ZT increases as thermal conductivity k decreases. The thermal conductivity k may decrease as a grain size of the thermoelectric material decreases. That is, as the grain size of the thermoelectric material decreases, phonon scattering by a grain boundary increases, which results in a reduction in lattice thermal conductivity. By using a preparation method according to one or more embodiments, thermoelectric material particles having an average diameter of about 100 nm, thermoelectric material particles having an average diameter of about 50 nm or less, or thermoelectric material particles having an average diameter of about 30 nm or less may be prepared. These particles diameters reduce the lattice thermal conductivity, whereby significantly improved thermoelectric properties may be obtained.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of preparing thermoelectric material particles, the method comprising:
   disposing a first electrode and a second electrode in a dielectric liquid medium, wherein the first and second electrodes each comprise a thermoelectric material;
   applying an electrical potential between the first and second electrodes to cause a spark between the first and second electrodes to provide a vaporized thermoelectric material at a sparking point of at least one of the first and second electrodes; and
   cooling the vaporized thermoelectric material with the dielectric liquid medium to prepare the thermoelectric material particles,
   wherein the thermoelectric material is a bulk thermoelectric material and comprises a Bi—Sb alloy, an Sb—Te alloy, a Bi—Te alloy, a Bi—Sb—Te alloy, a Bi—Sb—Te—Se alloy, or a combination thereof.

2. The method of claim 1, wherein the dielectric liquid medium comprises water, an organic solvent, a cryogenic liquefied gas, or a combination thereof.

3. The method of claim 2, wherein the dielectric liquid medium is water.

4. The method of claim 1, wherein the thermoelectric material is represented by the Formula 1:

$$Bi_xSb_yTe_z, \quad \text{Formula 1}$$

wherein $0 \leq x \leq 2$, $y=2-x$, and $2.7 \leq z \leq 3.3$.

5. The method of claim 4, wherein Formula 1 satisfies the conditions $0.001 \leq x \leq 1.999$, $y=2-x$, and $2.7 \leq z \leq 3.3$.

6. The method of claim 1, wherein the first and second electrodes comprise a cast, pressed, forged, or a crushed ingot.

7. The method of claim 1, wherein the first and second electrodes are each a rotating disk electrode and each consists of a bulk thermoelectric material.

8. The method of claim 1, wherein the disposing further comprises vibrating a plurality of charge pieces, which are disposed between the first and second electrodes, wherein the plurality of charge pieces comprise the thermoelectric material and a charge piece of the plurality of charge pieces is a bulk thermoelectric material.

9. The method of claim 1, wherein the electrical potential is about 50 to about 400 volts.

10. The method of claim 1, wherein the prepared thermoelectric material particles have an average particle diameter of about 10 to about 100 nanometers.

11. The method of claim 1, wherein the prepared thermoelectric material particles comprise nanoparticles having an average particle diameter of about 10 to about 100 nanometers and microparticles having a particle diameter of about 0.1 to about 10 micrometers.

12. The method of claim 11, wherein the microparticles comprise grains having a dimension of about 1 to about 50 nanometers.

13. The method of claim 1, wherein at least one of the first and second electrodes further comprises a filler.

14. The method of claim 13, wherein an amount of the filler is about 0.1 to about 20 weight percent, based on a total weight of an electrode comprising the filler.

15. The method of claim 1, wherein the dielectric liquid medium comprises a nano-dispersed filler or a dissolved filler.

16. The method of claim 15, wherein an amount of the nano-dispersed filler or the dissolved filler in the dielectric liquid medium is about 0.1 to about 10 volume percent, based on a total volume of the dielectric liquid medium.

\* \* \* \* \*